(12) United States Patent
Grodzki et al.

(10) Patent No.: US 8,947,087 B2
(45) Date of Patent: Feb. 3, 2015

(54) MAGNETIC RESONANCE APPARATUS WITH A BASIC FIELD MAGNET FORMED BY AT LEAST TWO SEPARATED MAGNETIC COILS

(75) Inventors: David Grodzki, Erlangen (DE); Bjoern Heismann, Erlangen (DE); Sebastian Schmidt, Weisendorf (DE)

(73) Assignee: Siemens Aktiengesellschaft, Munich (DE)

( * ) Notice: Subject to any disclaimer, the term of this patent is extended or adjusted under 35 U.S.C. 154(b) by 383 days.

(21) Appl. No.: 13/326,672

(22) Filed: Dec. 15, 2011

(65) Prior Publication Data
US 2012/0153953 A1    Jun. 21, 2012

(30) Foreign Application Priority Data
Dec. 15, 2010 (DE) .......................... 10 2010 063 128

(51) Int. Cl.
*G01V 3/00* (2006.01)
*G01R 33/38* (2006.01)
*G01R 33/34* (2006.01)
*G01R 33/381* (2006.01)
*G01R 33/385* (2006.01)

(52) U.S. Cl.
CPC ...... *G01R 33/3806* (2013.01); *G01R 33/34007* (2013.01); *G01R 33/381* (2013.01); *G01R 33/385* (2013.01)
USPC .......................................... 324/318; 324/319

(58) Field of Classification Search
USPC .................................. 324/318, 319, 320, 322
See application file for complete search history.

(56) References Cited

U.S. PATENT DOCUMENTS

| | | | |
|---|---|---|---|
| 4,429,277 A * | 1/1984 | Sugimoto | 324/309 |
| 4,875,485 A | 10/1989 | Matsutani | |
| 5,296,811 A | 3/1994 | Ehnholm et al. | |
| 6,241,669 B1 * | 6/2001 | Furuta et al. | 600/422 |

* cited by examiner

*Primary Examiner* — Louis Arana
(74) *Attorney, Agent, or Firm* — Schiff Hardin LLP

(57) ABSTRACT

A magnetic resonance apparatus for examination in THE teeth and/or jaw region of a patient has at least one basic magnet to generate a constant basic magnetic field. The basic magnet is formed at least in part from at least one magnetic coil pair with at least two magnetic coils, and the at least one magnetic coil pair generates the basic magnetic field with a homogeneous magnetic field region between the at least two magnetic coils thereof.

10 Claims, 1 Drawing Sheet

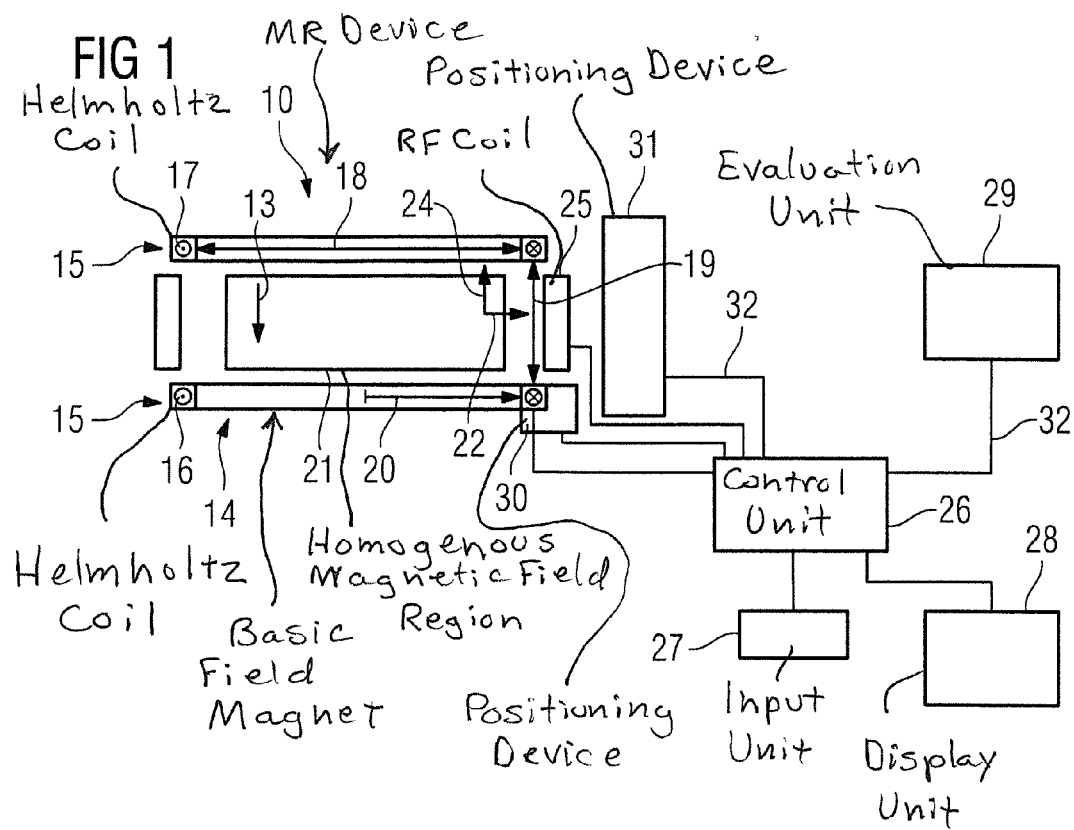
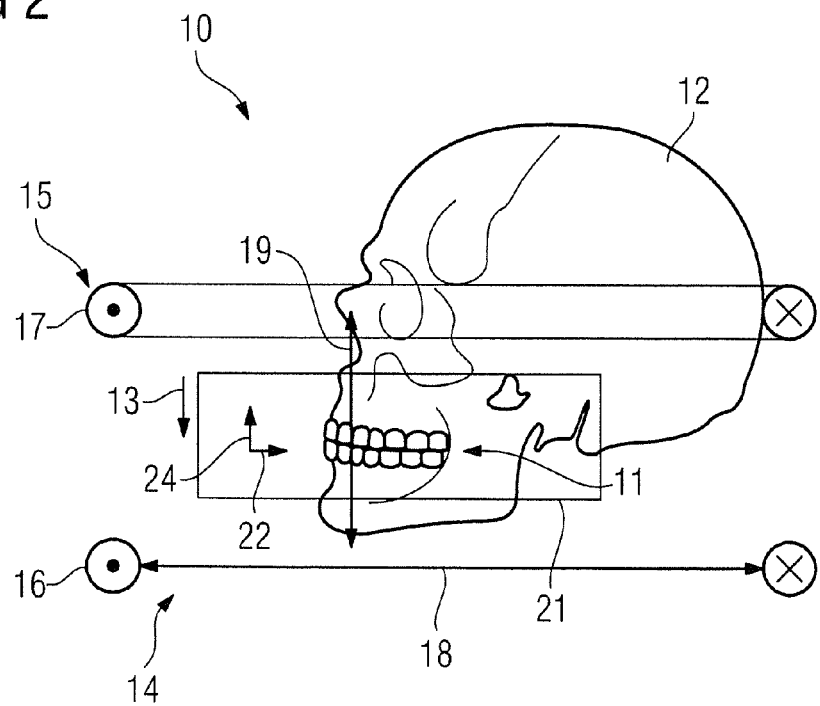

MAGNETIC RESONANCE APPARATUS WITH A BASIC FIELD MAGNET FORMED BY AT LEAST TWO SEPARATED MAGNETIC COILS

BACKGROUND OF THE INVENTION

1. Field of the Invention

The present invention concerns a magnetic resonance apparatus for examination in a teeth and/or jaw region of a patient, the apparatus having at least one basic magnet to generate a constant basic magnetic field.

2. Description of the Prior Art

Magnetic resonance apparatuses for examinations in the teeth region and/or jaw region of patients are used by dentists for treatments only if such magnetic resonance apparatuses have an especially compact and cost-effective design.

SUMMARY OF THE INVENTION

An object of the present invention is to provide a cost-effective and compact magnetic resonance device for examinations in the teeth and/or jaw region.

The invention is an improvement of a magnetic resonance apparatus for examination in the teeth and/or jaw region of a patient, the apparatus having at least one basic field magnet to generate a constant basic magnetic field.

The improvement according to the invention is that the basic field magnet is formed at least in part from a magnet coil pair composed of at least two magnet coils, and the at least one magnetic coil pair generates the basic magnetic field with a homogeneous magnetic field region between the at least two magnetic coils. This improvement results in a particularly cost-effective magnetic resonance apparatus because expensive superconducting magnets that require an additional cooling can be omitted to save costs and components. In addition, by the use of the at least one magnetic coil pair a compact magnetic resonance device is achieved with a significant weight savings, such that examinations can be implemented quickly and cost-effectively in the teeth and/or jaw region of a patient. The at least two magnetic coils can be formed by respective resistive magnetic coils so that unwanted external influences on the homogeneous basic magnetic field can be minimized and/or shielded. The magnetic resonance apparatus can be formed so as to be moved for a preparation of a magnetic resonance examination, which can be particularly advantageous in magnetic resonance examinations in the teeth and/or jaw region of a patient, because the magnetic resonance device can be aligned relative to the examination subject or the patient around the region of the patient that is to be examined. For this purpose, the magnetic resonance device, in particular a part of the magnetic resonance device that embodies the magnetic coil pair is supported or mounted such that the part can move along at least one axis and/or can be rotated around at least one axis. In addition, the magnetic resonance apparatus can be mounted on a movable articulated arm, for example, such that a flexible use of the magnetic resonance apparatus is possible. The homogeneous magnetic field region of the magnetic resonance device according to the invention is essentially limited to a region between the at least two magnetic coils.

If the at least one magnetic coil pair is formed by a Helmholtz coil pair, an essentially homogeneous basic magnetic field between the at least two magnetic coils can be generated with a simple design. A Helmholtz coil pair in this context means an arrangement of at least two short magnetic coils in which the at least two short magnetic coils are arranged in parallel with and concentric to one another, and the at least two magnetic coils each have a coil radius and are arranged relative to one another at a distance that corresponds at maximum to the coil radius. In addition to this, during operation electric current flows through the at least two magnetic coils of the Helmholtz coil pair in the same direction. Considered independently, a magnetic field caused by one of the at least two magnetic coils is non-homogeneous by design, but an essentially homogeneous complete (total) magnetic field is generated between the at least two magnetic coils by a superimposition of the at least two inhomogeneous magnetic fields of the respective at least two individual magnetic coils.

In another embodiment, the homogeneous magnetic field region has a maximum dimension of essentially 25 cm along the x-direction and/or the y-direction of a Cartesian coordinate system of which the z-axis proceeds through the central openings of the at least two magnetic coils. A homogeneous magnetic field region, and thus a small field of view (FOV) that is sufficiently small for an examination of the teeth and/or jaw region thus can be produced so that the constant basic magnetic field can be realized particularly simply with the homogeneous magnetic field region. A minimum dimension of the homogeneous magnetic field region is particularly advantageously 13 cm along the x-direction and/or the y-direction. A dimension of the homogeneous basic magnetic field along the x-direction and/or the y-direction can additionally be dependent on the embodiment of the coil arrangement, for example the distance of the at least two magnetic coils from one another and/or the coil diameter of the magnetic coils and/or the number of windings of the individual magnetic coils, etc. In this context, "essentially 25 cm" and "essentially 13 cm" are size specifications with a tolerance range of approximately ±5 cm, particularly advantageously with a tolerance range of approximately ±2 cm.

In addition, the homogeneous magnetic field region preferably advantageously has a maximum dimension of essentially 8 cm along the z-direction. As used herein "essentially 8 cm" means a size specification with a tolerance range of approximately ±3 cm, and particularly advantageously with a tolerance range of approximately ±1.5 cm. As noted above, the z-direction is aligned along the spacing between the two magnetic coils, and the x-direction and/or the y-direction are aligned perpendicularly to one another and perpendicularly to the z-direction within the winding plane of the coils.

In a further embodiment of the invention, at least one of the magnetic coils has a coil diameter of at least approximately 20 cm and at most approximately 35 cm. This results in a particularly compact magnetic resonance apparatus that can be used for different anatomical developments of the cranial region or the jaw region of different patients.

The at least two magnetic coils preferably have a separation between them of approximately 10 cm, allowing a particularly compact magnetic resonance apparatus to be achieved with a small field of view, but the field of view is large enough for examination in the teeth region and/or jaw region of the patient. The distance between the two magnetic coils can additionally be less than 10 cm, with a homogeneous magnetic field region being maintained between the two magnetic coils during operation of the magnetic resonance device.

A particularly compact magnetic resonance device that saves on components can be achieved in an embodiment wherein the at least one magnetic coil pair generates a magnetic field gradient along at least one direction. A different amperage is advantageously applied during operation of the magnetic resonance apparatus or the at least one magnetic coil pair of the at least two magnetic coils, such that a magnetic field gradient can be generated between the at least two magnetic coils, namely along the z-direction. Furthermore, the constant basic magnetic field generated along the x-direction and/or the y-direction by means of the at least two magnetic field coils is advantageously designed to be homogeneous, such that generation of the magnetic field gradient by means of the magnetic coil pair can also be simultaneously achieved in addition to a generation of the constant and homogeneous basic magnetic field.

Due to the field of application of the magnetic resonance device according to the invention for examinations of the teeth region and/or jaw region of patients, the magnetic resonance device can be operated with a low basic magnetic field, in particular a basic magnetic field with a maximum magnetic field strength of approximately 0.3 T, so high operating costs can additionally be spared that, for example, occur in the case of generation of a basic magnetic field with a high magnetic field strength.

In another embodiment of the invention, a first magnetic coil of the at least one magnetic coil pair is arranged so that it can be moved relative to a second magnetic coil of the at least one magnetic coil pair for a positioning process in which a patient is positioned for a magnetic resonance measurement. A particularly comfortable positioning of the patient—in particular the head region and/or the jaw region of the patient—can be achieved within the magnetic resonance apparatus, and the magnetic resonance apparatus can additionally be particularly simply aligned around the region of the patient that is to be examined. The movement of the first magnetic coil relative to the second magnetic coil can take place along one axis—for example a shifting of the first magnetic coil along the axis—and/or take place by means of a tilting and/or an at least partial rotation of the first magnetic coil around an axis.

BRIEF DESCRIPTION OF THE DRAWINGS

FIG. 1 shows a magnetic resonance device according to the invention in a schematic presentation.

FIG. 2 shows a portion of the magnetic resonance device with a patient.

DESCRIPTION OF THE PREFERRED EMBODIMENTS

A magnetic resonance (MR) device 10 according to the invention is schematically shown in FIGS. 1 and 2. The magnetic resonance device 10 is designed for magnetic resonance examinations, in particular the teeth region and/or the jaw region 11 of a patient 12.

The magnetic resonance device 10 has a basic field magnet 14 formed by a magnetic coil pair to generate a basic magnetic field 13. The magnetic coil pair is formed as a Helmholtz coil pair 15 having two individual Helmholtz coils 16, 17 that are individually formed by resistive magnetic coils, such that an external influencing of the basic magnetic field 13 and/or an examination volume (field of view) can be suppressed and/or shielded. The two Helmholtz coils 16, 17 are each formed by short, cylindrical magnetic coils, with a coil diameter 18 of each of the magnetic coils is multiple times larger than a length of a coil cylinder of the magnetic coil. The two Helmholtz coils 16, 17 have an identical design, in particular an identical coil diameter 18 and/or an identical coil width etc. Within the magnetic resonance device 10, the two Helmholtz coils 16, 17 are arranged parallel and concentric to one another for an examination measurement or, respectively, for a magnetic resonance measurement. In addition, the two Helmholtz coils 16, 17 are arranged at a distance 19 from one another that at maximum corresponds to a coil radius 20 of the two Helmholtz coils 16, 17. As an alternative to this, the two Helmholtz coils 16, 17 can also have a separation from one another that is less than a coil radius of the two Helmholtz coils 16, 17.

In an operation of the magnetic resonance device 10, respective currents flow through the two Helmholtz coils 16, 17, with a flow direction of the current flowing through the first Helmholtz coil 16 being parallel to the flow direction of the current flowing through the second Helmholtz coil 17. A magnetic field is thereby induced in each of Helmholtz coils 16, 17, each magnetic field being individually inhomogeneous when considered separately. However, an essentially homogeneous magnetic field region 21 is generated by a superimposition of the two induced magnetic fields in the region between the two Helmholtz coils 16, 17.

The coil diameter 18 of the two Helmholtz coils 16, 17 amounts to at least 20 cm, such that a head of the patient 12—in particular the jaw region and/or the teeth region of the patient 12—can be placed in the homogeneous magnetic field region 21 within the Helmholtz coils 16, 17 for a magnetic resonance measurement (FIG. 2). However, the coil diameter 18 of each of the two Helmholtz coils 16, 17 particularly advantageously amounts to 25 cm to 30 cm, such that an easy introduction of the patient head into the coil region is possible. In order to maintain an advantageous compactness of the magnetic resonance device 10 that can be moved for the magnetic resonance examinations, the coil diameter 18 should be limited to a maximum of approximately 35 cm. The maximum separation 19 of the two Helmholtz coils 16, 17 from one another that these take up for a magnetic resonance measurement thus also results depending on the coil diameter 18. The maximum separation 19 of the two Helmholtz coils 16, 17 is half of the coil diameter 19, and thus amounts essentially to between 10 cm and a maximum of 17.5 cm. In an alternative embodiment of the invention, the distance 19 between the two Helmholtz coils 16, 17 can be less than 10 cm.

The two Helmholtz coils 16, 17 of the Helmholtz coil pair 15 are arranged relative to one another such that the first Helmholtz coil 16 is arranged such that it can be moved relative to the second Helmholtz coil 17 for a positioning process in which the patient 12 is positioned within the magnetic resonance device 10 (in particular between the two Helmholtz coils 16, 17, and therefore in a homogeneous magnetic field region 21 of the Helmholtz coil pair 15) for a magnetic resonance measurement. The first Helmholtz coil 16 can hereby be displaced along an axis, for example along an axis parallel or perpendicular to the second Helmholtz coil 17, and/or can be supported such that it can be rotated and/or tilted around an axis. An opening for an insertion of the patient 12—in particular the head region and/or the jaw region 11 of the patient 12—into the magnetic resonance device 10 can advantageously be enlarged so, after correct positioning of the patient 12 within magnetic resonance device 10, the first Helmholtz coil 16 is subsequently brought into a measurement position again in which said first Helmholtz coil 16 is arranged in parallel and concentric to the second Helmholtz coil 17. For a movable arrangement of the first Helmholtz coil 16, the magnetic resonance device 10 has a positioning unit 30 (FIG. 1) by means of which a movement of the first Helmholtz coil 16 takes place relative to the second Helmholtz coil 17, and in particular the exact alignment of the first Helmholtz coil 16 takes place relative to the second Helmholtz coil in the measurement position. The positioning unit 30 can be formed by a mechanical positioning unit 30, and/or particularly advantageously by an electronic positioning unit 30. As an alternative to this, the two Helmholtz coils 16, 17 can also be arranged immobile or rigid relative to one another within the magnetic resonance device 10.

In operation of the magnetic resonance device 10, a basic magnetic field 13 with a homogeneous magnetic field region 21 is generated by means of the Helmholtz coil pair 15, which magnetic field region 21 is arranged between the two Helmholtz coils 16, 17. The homogeneous magnetic field region 21 generated by the two Helmholtz coils 16, 17 has a dimension along an x-direction 22 and/or a y-direction, which dimension has a minimum length of essentially 13 cm and a maximum length of essentially 25 cm. The x-direction 22 and the y-direction are aligned orthogonal to one another, wherein the y-direction is perpendicular to the plane of the drawing. The x-direction 22 and the y-direction span a plane that is aligned parallel to a base surface of the coil cylinder of the two Helmholtz coils 16, 17. The homogeneous magnetic field region 21 has a dimension of essentially 8 cm along the z-direction 24, which is aligned orthogonal to the x-direction 22 and orthogonal to the y-direction, and thus travels essentially parallel to a distance 19 between the two Helmholtz coils 16, 17. The values for the homogeneous magnetic field region 21 along the x-direction 22, the y-direction and the z-direction 24 are additionally dependent on a design of the Helmholtz coil pair 15, in particular the coil radius 20 and/or the separation 19 of the two Helmholtz coils 16, 17 and/or a number of windings that the individual Helmholtz coils 16, 17 have etc. In an alternative arrangement of the two Helmholtz coils 16, 17, these values can also differ from the values described here.

The homogeneous basic magnetic field 13 generated by means of the Helmholtz coil pair 15 has a field strength of at most approximately 0.3 Tesla. A magnetic flux density of the constant basic magnetic field 13 is parallel to the z-direction 24.

Furthermore, the two Helmholtz coils 16, 17 are provided for a magnetic resonance measurement to generate a magnetic field gradient along the z-direction 24. In operation of the Helmholtz coil pair 15, a current with an amplitude that is different than an amplitude of a current applied to the second Helmholtz coil 17 flows at the first Helmholtz coil 16. A magnetic field gradient is thus generated along the z-direction 24, and furthermore the basic magnetic field 13 with the homogeneous magnetic field region 21 is additionally maintained along the x-direction 22 and the y-direction.

In addition, the magnetic resonance device 10 has additional components and modules that are required for a magnetic resonance measurement. Radio-frequency pulses for the magnetic resonance measurement are generated by means of a radio-frequency (RF) coil 25 of the magnetic resonance device 10. In addition, the magnetic resonance device 10 has a control unit 26 by means of which a control of the magnetic resonance device 10 takes place to implement a magnetic resonance measurement. The magnetic resonance device 10 also has an input unit 27, in particular to input user-specific parameters, and a display unit 28 that is provided to display and/or present magnetic resonance exposures etc. A control of the positioning unit 30 for the movement of the first Helmholtz coil 16 relative to the second Helmholtz coil 17 takes place by means of the control unit 26.

Furthermore, a partial region of the magnetic resonance device 10 comprising the radio-frequency coil 25 is aligned and/or arranged such that it can move relative to an examination region of the patient 12. This partial region of the magnetic resonance device 10 is supported such that it can be moved around and/or along at least one axis, such that a displacement and/or a rotation of the magnetic resonance device 10 relative to the patient is possible to align the magnetic resonance device 10. The magnetic resonance device 10 includes an additional positioning unit 31 by means of which at least the portion of the magnetic resonance device 10 that embodies the basic magnet 14 is positioned for a measurement position around the patient 12. For example, the second positioning device 31 can have an articulated arm that can be pivoted in at least one direction, on which articulated arm is arranged at least the portion of the magnetic resonance device 10 embodying the basic magnet 14. The positioning unit 30 can be formed as a mechanical positioning unit, and/or particularly advantageously an electronic positioning unit. Additional embodiments of the second positioning unit 31 and/or movable embodiments of the magnetic resonance device 10 are possible at any time.

A control of the second positioning unit 30 takes place by means of the control unit 26. The control unit 26 can be arranged in an immobile portion of the magnetic resonance device 10, for example in a permanently arranged console that controls second positioning unit 31 for the movement and/or positioning of the movable partial region with the two Helmholtz coils 16, 17 and the refocusing 25. As an alternative to this, the positioning unit 31 can be designed such that a manual control of the positioning unit 31 by an operator can take place.

In addition, the measurement data can be relayed by the control unit 26 to an evaluation unit 29 of the magnetic resonance device 10. There an evaluation of the measurement data takes place, so possible nonlinearities that can arise upon generation of the magnetic field gradients by means of the two Helmholtz coils 16, 17 can be compensated by calculation.

The individual units and components are connected with the control unit 26 via a data line 32 for a data exchange.

The shown magnetic resonance apparatus 10 can naturally have additional components of the type that magnetic resonance apparatuses conventionally have. The basic functioning of a magnetic resonance apparatus is known to those skilled in the art so that a detailed description of the basic components is not necessary herein.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance apparatus comprising:
    a basic field magnet comprising at least one magnetic coil pair comprised of at least a first magnetic coil and a second magnetic coil spaced from each other with an examination region therebetween;
    a control unit configured to operate said basic field magnet by applying a first current, having a first amplitude, to said first magnetic coil and applying a second current, having a second amplitude that is different from said first amplitude, to said second magnetic coil, and thereby causing said first magnetic coil to produce a first magnetic field and said second magnetic coil to produce a second magnetic field that differs from said first magnetic field and that is superimposed on said first magnetic field to produce a superimposed field comprising a basic magnetic field that is homogenous in at least a portion of said examination region, and said superimposed field also exhibiting a magnetic field gradient in said examination region; and
    a radio-frequency (RF) transmission and reception system that radiates RF energy into an examination subject situated in said examination region that deflects nuclear spins in said examination subject out of an alignment produced in said homogenous portion of said basic magnetic field, in order to cause said nuclear spins to emit magnetic resonance signals that are spatially encoded exclusively by said gradient of said superimposed field.

2. A magnetic resonance apparatus as claimed in claim 1 wherein said at least one magnetic coil pair is a Helmholtz coil pair.

3. A magnetic resonance apparatus as claimed in claim 1 wherein each of said first and second coils has a coil axis proceeding therebetween along a z-direction of a Cartesian coordinate system, and wherein said first and second coils are configured to produce said homogenous portion of said basic magnetic field with a maximum dimension of at least approximately 25 cm in at least one of an x-direction of said Cartesian coordinate system and a y-direction of said Cartesian coordinate system.

4. A magnetic resonance apparatus as claimed in claim 1 wherein said first and second coils has a coil axis proceeding therebetween along a z-direction of a Cartesian coordinate system, and wherein said first and second coils are configured to produce said homogenous portion of said basic magnetic field with a minimum dimension of at least approximately 13 cm in at least one of an x-direction of said Cartesian coordinate system and a y-direction of said Cartesian coordinate system.

5. A magnetic resonance apparatus as claimed in claim 1 wherein said at least one magnetic coil pair has a coil axis along a z-direction of a Cartesian coordinate system, and wherein said at least one magnetic coil pair is configured to produce said homogenous portion of said basic magnetic field with a maximum dimension of approximately 8 cm along said z-direction.

6. A magnetic resonance apparatus as claimed in claim 1 wherein said at least one magnetic coil pair has a minimum coil diameter of approximately 20 cm.

7. A magnetic resonance apparatus as claimed in claim 1 wherein said at least one magnetic coil pair has a maximum coil diameter of approximately 35 cm.

8. A magnetic resonance apparatus as claimed in claim 1 wherein said at least two magnetic coils have a spacing therebetween of approximately 10 cm.

9. A magnetic resonance apparatus as claimed in claim 1 wherein said basic field magnet is configured to generate said basic magnetic field with a maximum field strength of approximately 0.3 T.

10. A magnetic resonance apparatus as claimed in claim 1 wherein a first magnetic coil is movable relative to said second magnetic coil, to allow positioning of a patient between said first and second magnetic coils.

* * * * *